United States Patent [19]

McKeag et al.

[11] Patent Number: 5,502,300

[45] Date of Patent: Mar. 26, 1996

[54] COMPOUND OPTICALLY TIPPED DETECTORS

[75] Inventors: William O. McKeag, Santa Barbara; Russell D. Granneman, Goleta, both of Calif.

[73] Assignee: Santa Barbara Research Center, Goleta, Calif.

[21] Appl. No.: 44,437

[22] Filed: Mar. 31, 1993

[51] Int. Cl.$^6$ .................................................. H01J 3/14
[52] U.S. Cl. ........................................ 250/216; 250/222.2
[58] Field of Search ................................ 250/216, 208.1, 250/214.1, 222.2; 359/831, 837

[56] References Cited

U.S. PATENT DOCUMENTS

| | | | |
|---|---|---|---|
| 3,547,546 | 12/1970 | Schier . | |
| 4,912,317 | 3/1990 | Mohan et al. | 250/222.2 |
| 4,994,664 | 2/1991 | Veldkamp | 250/216 |
| 5,124,546 | 6/1992 | Hu | 250/216 |
| 5,204,520 | 4/1993 | Green | 250/214.1 |

OTHER PUBLICATIONS

"Coherent Laser Beam Addition: An Application of Binary-Optics Technology" by J. R. Leger et al., The Lincoln Laboratory Journal, vol. 1, No. 2, 1988 pp. 225–245.

"Optical Design with Diffractive Lenses" by D. Falkis and G. M. Morris, Photonics Spectra, Nov. 1991, pp. 205–208.

"Binary Optics", by W. B. Veldkamp and T. J. McHugh, Scientific American, May 1992, pp. 92–97.

"Coherent Addition of AlGaAs Lasers using Microlenses and Diffractive Coupling" by J. R. Leger et al., Appl. Phys. Lett. 52(21), May 23, 1988, pp. 1771–1772.

*Primary Examiner*—David C. Nelms
*Assistant Examiner*—K. Shami
*Attorney, Agent, or Firm*—W. C. Schubert; W. K. Denson-Low

[57] ABSTRACT

A focal plane array (10) of radiation detectors (10b) has all features inclined with respect to an illuminating beam of radiation. That is, all features that would be orthogonally disposed with respect to an incoming wavefront are instead inclined to the incoming wavefront, an arrangement referred to as compound tipping. The disclosed embodiments of the invention create a compound tipping of the focal plane array such that there are no features of the array, such as mesa edges and sidewalls, that lie in the plane of the incoming wavefront. As a result, only a small amount of scattered light is observed, and the optical signature is significantly reduced. The invention substantially eliminates the optical signature by simultaneously tipping the focal plane features (optically and/or mechanically) in both major array axes, without degrading the imaging performance of the detective assembly.

26 Claims, 3 Drawing Sheets

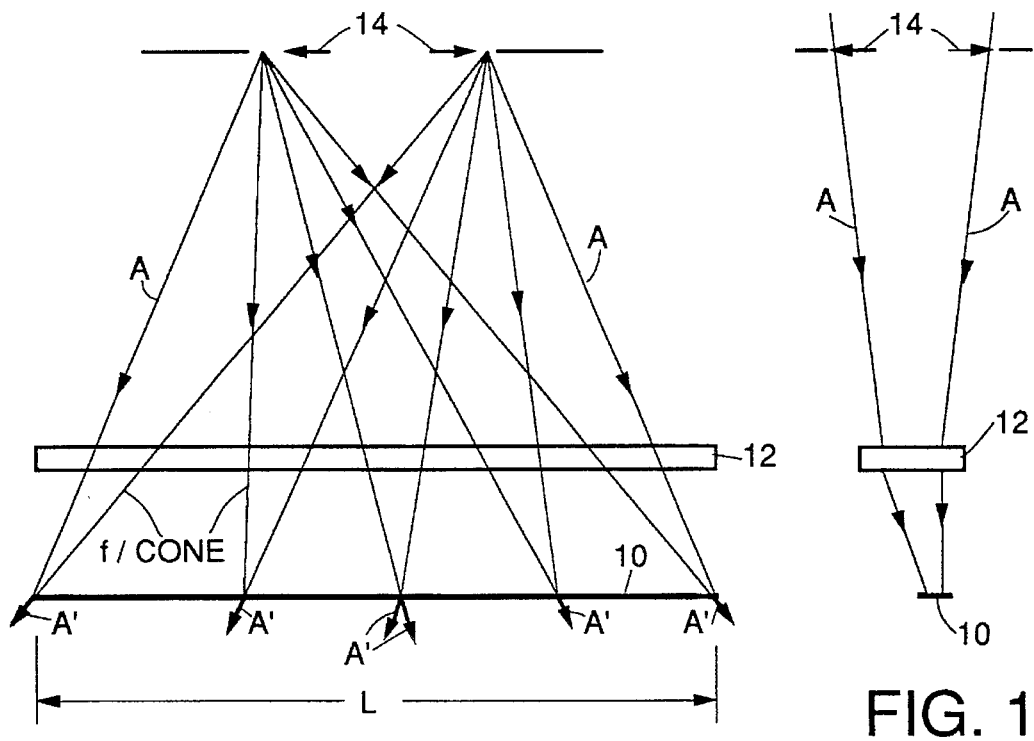
FIG. 1a.
FIG. 1b.
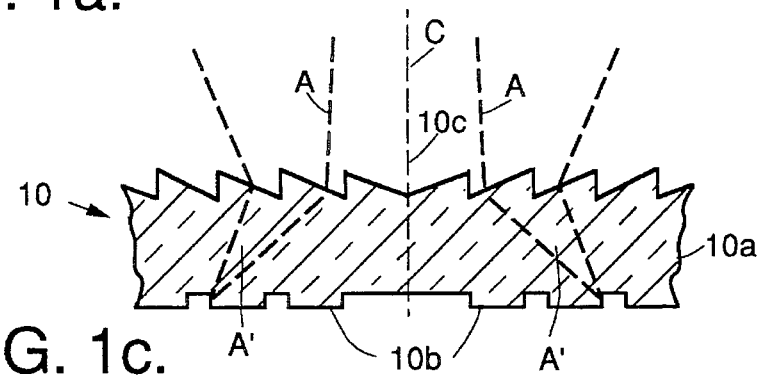
FIG. 1c.
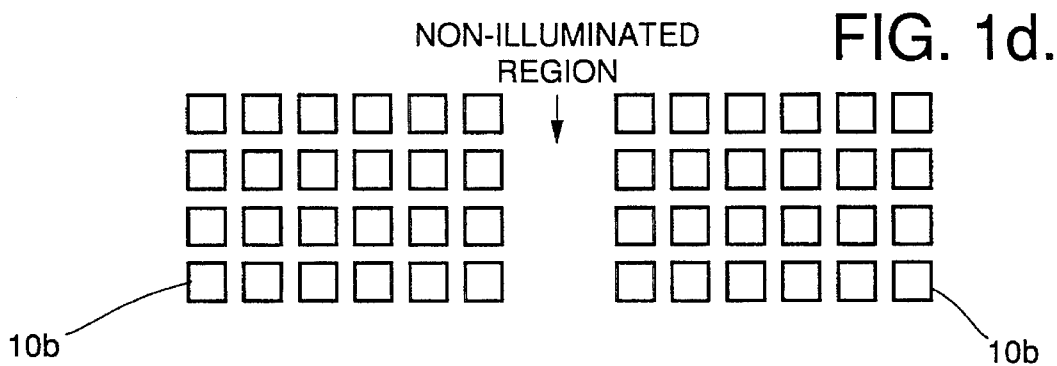
FIG. 1d.

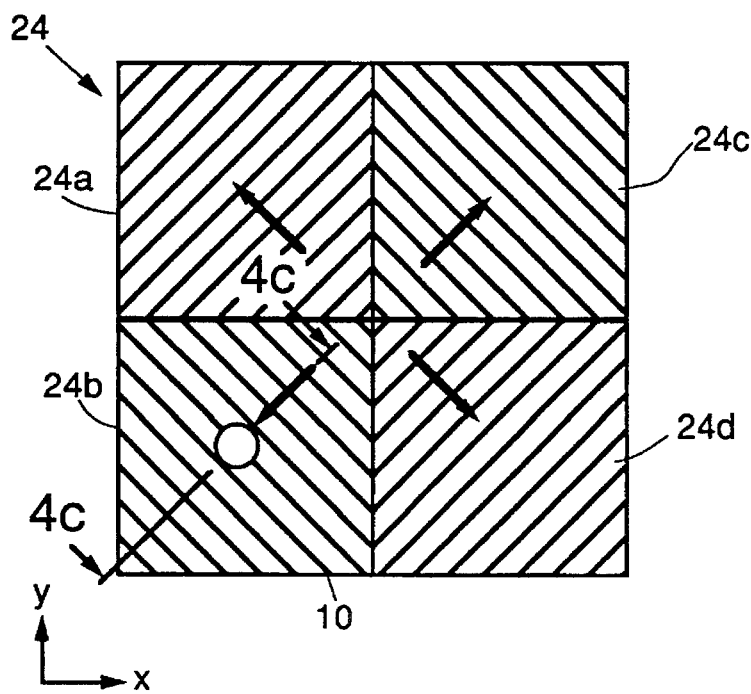
FIG. 4a.
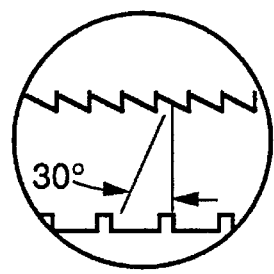
FIG. 4c.
FIG. 4b.
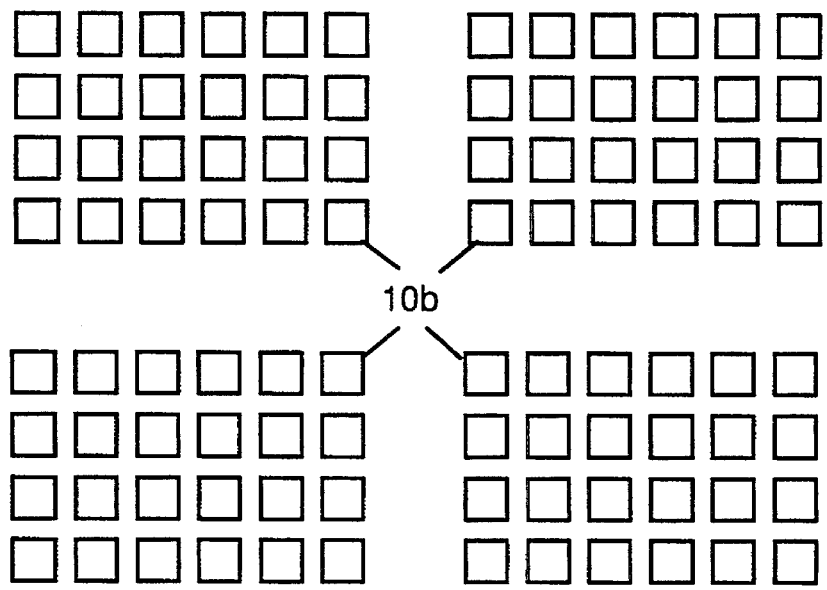

COMPOUND OPTICALLY TIPPED DETECTORS

FIELD OF THE INVENTION

This invention relates generally to radiation detectors and, in particular, to focal plane arrays (FPAs) of radiation detectors.

BACKGROUND OF THE INVENTION

Infrared (IR) radiation detectors provide an electrical output which is a measure of incident IR radiation. One particularly useful IR detector is a photovoltaic (PV) detector fabricated from Group II–VI radiation absorbing semiconductor material, such as mercury-cadmium-telluride (HgCdTe). HgCdTe detectors are typically fabricated as linear and two-dimensional arrays. Generally, a transparent substrate supports a radiation absorbing semiconductor layer having a first electrical conductivity, and a second semiconductor layer of opposite electrical conductivity forms a p-n junction with the first layer. The array may be differentiated into a plurality of p-n junctions by selectively removing the semiconductor material, resulting in the formation of a plurality of upstanding "mesa" structures, each of which contains a radiation detecting element, or pixel. The array typically includes a layer of passivation applied to an outer surface so as to reduce surface states and resulting noise signals that detrimentally affect the operation of the p-n junction. An anti-reflection (AR) coating may also be applied over the passivation layer to reduce reflections of incident radiation. Each of the radiation detecting elements includes a contact, normally provided in the form of one or more square or round metal pads. The contact pad(s) provides electrical contact for external read-out circuitry, typically via an indium "bump" interconnect, to the p-n junction. If radiation enters the array through the bottom surface of the substrate, that is, the surface opposite to the surface that supports the radiation absorbing semiconductor layer, the array is referred to as a "backside-illuminated" array.

Incident radiation may be directed to the array with a beam steering device such as a dual prism, microprisms, or an array of diffractive binary lens elements. It is conventional practice to tilt or rotate the detector array through the use of a beam streering device about one axis such that a radiation receiving surface of the array is inclined at an angle to incident radiation.

A problem that is presented during the use of such detector arrays results from reflection of radiation from array features, such as the edges of the contact pads, mesa sidewall surfaces, and the like. This reflected radiation is radiation that first passes unabsorbed through the substrate, the radiation absorbing semiconductor layer, and the overlying layer of opposite conductivity. This unabsorbed radiation eventually encounters the array "top-side" edges and features and is reflected therefrom back through the body of the array. If the reflected radiation is not absorbed during the second pass through the array, the radiation emerges from the bottom surface of the substrate and may propagate back into space. This propagating radiation signal is often referred to as a "light signature". Significant contributors to the light signature are reflections from the contact pad edges and mesa edges.

As was stated, in prior detective assemblies the focal plane array was tilted, or tipped, in only one axis. However, this arrangement leaves many array features (edges of mesas and contact pads) orthogonally disposed to the illuminating beam, resulting in relatively large optical signatures from these edges.

It is thus an object of this invention to significantly reduce the light signature of a focal plane array.

It is a further object of this invention to significantly reduce the optical signature of a focal plane array by simultaneously tipping the focal plane features (optically and/or mechanically) in both major array axes, without degrading the imaging performance of the detective assembly.

SUMMARY OF THE INVENTION

The foregoing problems are overcome and other advantages are realized by a focal plane array of radiation detectors wherein all features are inclined with respect to an illuminating beam of radiation. In the presently preferred embodiments of the invention all features that would be orthogonally disposed with respect to an incoming wavefront are instead inclined to the incoming wavefront, an arrangement that is referred to herein as compound tipping. That is, the disclosed embodiments of the invention create a compound tipping of the focal plane array such that there are no features lying in the plane of the incoming wavefront. As a result, only a small amount of scattered light is observed, and the optical signature is significantly reduced.

This invention virtually eliminates the optical signature by simultaneously tipping the focal plane features (optically and/or mechanically) in both major array axes, without degrading the imaging performance of the detective assembly.

The invention thus provides a method for reducing an optical signature from a focal plane array of radiation detectors. The method includes the steps of (a) providing an array of radiation detectors, the array having first and second axes; (b) tilting the array, with respect to an incident beam of radiation, along a first one of the axes; and (c) tilting the array, with respect to the incident beam of radiation, along a second one of the axes such that a spatial extent of intersections of features of the array, with wavefronts of the radiation, are minimized, thereby reducing reflections of the radiation from the features.

In one embodiment of the invention the first and the second steps of tilting are both accomplished by physically tilting the array of radiation detectors with respect to the incident beam of radiation. In another embodiment of the invention the first and the second steps of tilting are both accomplished by optically tilting the array of radiation detectors with respect to the incident beam of radiation. In a further embodiment of the invention one of the steps of tilting is accomplished by optically tilting the array of radiation detectors with respect to the incident beam of radiation, and the other one of the steps of tilting is accomplished by physically tilting the array of radiation detectors with respect to the incident beam of radiation.

Optical tilting of the array may be performed by a beam steering device that is disposed within an optical path of the incident beam of radiation, and/or by a microprism array that is fabricated upon or within a radiation receiving surface of the array of radiation detectors.

Furthermore, the first step of tilting may be performed by a beam steering device that is disposed within an optical path of the incident beam of radiation, while the second step of tilting may be accomplished by a physical rotation of the features of the radiation detectors.

BRIEF DESCRIPTION OF THE DRAWING

The above set forth and other features of the invention will be made more apparent in the ensuing Detailed Description of the Invention when read in conjunction with the attached Drawing, wherein:

FIG. 1a is a frontal view showing a portion of a radiation detector assembly having a split microprism detector array;

FIG. 1b is a side view of the assembly of FIG. 1a;

FIG. 1c shows in greater detail a cross section of the detector array of FIGS. 1a and 1b having microprisms formed on a radiation receiving surface and an array of detector sites or pixels formed on an opposite surface;

FIG. 1d is a top view showing a resulting pixel layout of a detector array using split microprisms to achieve compound tipping;

FIG. 4a is a top view of a four quadrant microprism,

FIG. 4b shows a resulting pixel layout for a 10×10 staring array using the quadrant microprism of FIG. 4a; and FIG. 4c shows an enlarged cross sectional view of the detector array taken along the section line 4c—4c.

DETAILED DESCRIPTION OF THE INVENTION

Figure 2A:
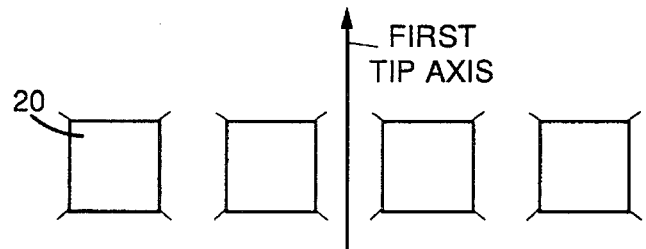
FIG. 2a shows a conventional pixel layout with respect to a first tip axis.

In general, this invention teaches the arrangement of the components of an IR detector assembly such that the focal plane physical features, such as mesa delineation grooves, contact metal pad edges, and optical mask edges, intersect all arriving light wavefronts at, ideally, a single point. This is accomplished by optically and/or mechanically tipping the focal plane along both major axes simultaneously, also referred to herein as a compound tipping of the IR detector assembly.

If an array feature intersects a wavefront as a line, as occurs in the case of the single axis rotation of the prior art, then a large optical signature can be produced. In that the illuminating light is input to the detector assembly by imaging optics, there are a family of wavefronts of varying angles that impinge on the detector focal plane. These angles are represented by the f/cone of the optical system.

In accordance with the invention, this range of angles is considered in determining the amount of tip to be introduced for both major detector assembly axes, so that the intersections of all features with all possible wavefronts are reduced from lines to, ideally, points, thereby significantly reducing the optical signature. That is, the spatial extent of intersections of the features of the pixels, with wavefronts of the radiation, are minimized, thereby reducing reflections of the radiation from the features.

In general, the compound tip angle is made to be greater than one half of the angle of the f/cone.

Reference is now made to FIGS. 1a–1d for showing a first embodiment of a compound tipped radiation detector assembly 1. The detector array assembly 1 includes a focal plane detector array 10, a beam steering device 12, such as a dual prism or an array of binary diffraction elements, and a stationary exit pupil 14. Shown in FIG. 1a are five f/cones of incident IR radiation. The detector array 10 is comprised of, by example, Group II–VI semiconductor material, such as HgCdTe, and is responsive to radiation within the infrared (IR) spectrum. IR radiation (A) emanating from a scene passes through the pupil 14 and is directed by the beam steering device 12 to a radiation receiving surface of the detector array 10.

As seen in FIG. 1c, the radiation is incident upon a backside major surface of the detector array 10, which includes a transparent substrate 10a having a plurality of detector mesa sites, or pixels 10b, formed on an opposite frontside major surface. In this embodiment of the invention the backside surface has fabricated therein or thereon an array of diffractive optical elements, or microprisms 10c.

The specification and fabrication of such diffractive optical elements within a surface of a substrate is a known technique, and is described in, by example, an article entitled "Optical Design with Diffractive Lenses" by D. Falkis and G. M. Morris, Photonics Spectra, Nov. 1991, pps 205–208, an article entitled "Binary Optics" by W. B. Veldkamp and T. J. McHugh, Scientific American, May 1992, pps. 92–97, an article entitled "Coherent addition of AlGaAs lasers using microlenses and diffractive coupling" by J. R. Leger et al., Appl. Phys. Lett. 52(21), May 23, 1988, pps. 1771–1772, and an article entitled "Coherent Laser Beam Addition: An Application of Binary-Optics Technology" by J. R. Leger et al., The Lincoln Laboratory Journal, Vol. 1, No. 2, 1988 pps. 225–245. Also of interest are, by example, U.S. Pat. No. 3,547,546, issued May 4, 1966, "Multiple Image Forming Device" by H. Schier, U.S. Pat. No. 4,530,736, issued Jul. 23, 1985, "Method for Manufacturing Fresnel Phase Reversal Plate Lenses" by W. E. Mutter, and U.S. Pat. No. 4,994,664, issued Feb. 19, 1991, entitled "Optically Coupled Focal Plane Arrays Using Lenslets and Multiplexers" by W. B. Veldkamp.

In the embodiment of FIG. 1c the beam steering device 12 of FIGS. 1a and 1b is employed to introduce focal plane tip, such as 30°, along a first tip axis of the array 10. Tip in a second axis that is approximately orthogonal to the first axis is introduced by the array of microprisms 10c, which may be fabricated as binary devices. Tip in the second axis is also, by example, 30°. The microprism array 10c is arranged to tip the input beam A, illustrated by the beams A', along a second tip axis of the array 10. The microprism array 10c is divided, or split in the center (C) of the detector array 10, such that the direction of tip along the second tip axis is always outward from the center. This split enables the resulting detector assembly to interface optically with a reimaged system having the stationary exit pupil 14, which is small relative to the focal plane height. That is, the width of the pupil 14 is small with respect to the length (L) of the long axis of the detector array 10.

The split in the microprism array 10c results in a non-illuminated region in the center of the detector array 10. As seen in FIG. 1d, and in accordance with an aspect of this invention, the physical layout of the detector array pixels 10b is arranged so as to compensate for the presence of the non-illuminated region.

The tipped input beam A' can be seen to impinge on the frontside features of the array 10 at an angle other than 90° which, in combination with the tip in the other axis introduced by the beam steering device 12, advantageously reduces the optical signature. In the embodiment of FIGS. 1a–1d the compound tip is 30°×30°.

Figure 2B:
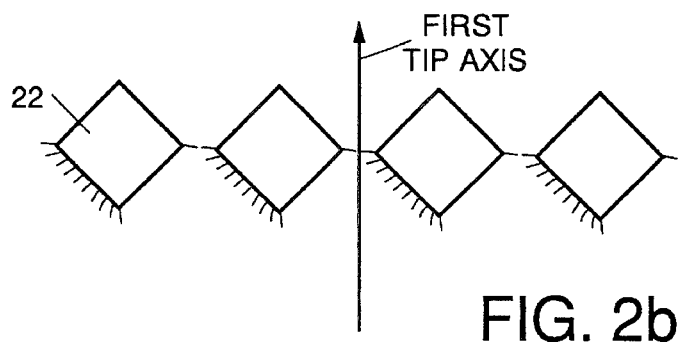
FIG. 2b shows a compound tip pixel layout with respect to the first tip axis.

FIG. 2a shows a conventional pixel 20 layout with respect to a first tip axis; and FIG. 2b shows a compound tip pixel 22 layout, also with respect to the first tip axis. In this embodiment of the invention the beam steering device 12 (not shown) is employed to introduce tip along the first tip axis. The second axis is tipped by physically rotating, during fabrication of the detector array, the edges of the detector pixels (mesas) 22 relative to the first tip axis. As can be seen, the plurality of radiation detector mesa structures 22 are disposed, relative to the first tip axis of the array, in such a manner that no linear features of the mesa structures are oriented perpendicularly to the tip axis, thereby reducing reflections from these linear features. This results in the detector pixel mesas having, by example, a diamond-shape or hexagonal-shape as compared to the conventional square or rectangular pixels 20.

Figure 3A:
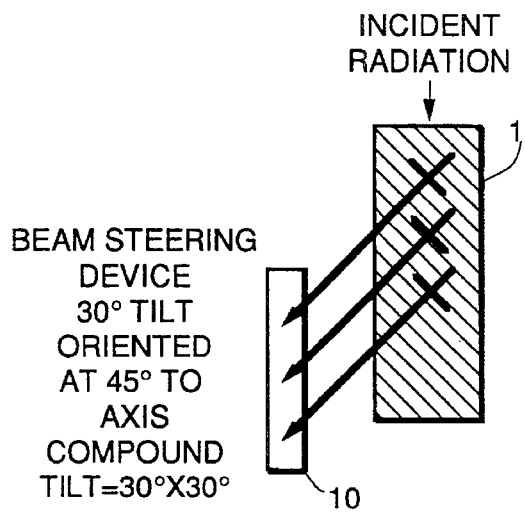
FIG. 3a is a top view showing the position of a detector array with respect to a beam steering device.
Figure 3B:
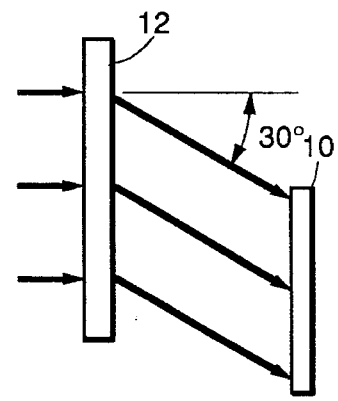
FIG. 3b is a side view.
Figure 3C:
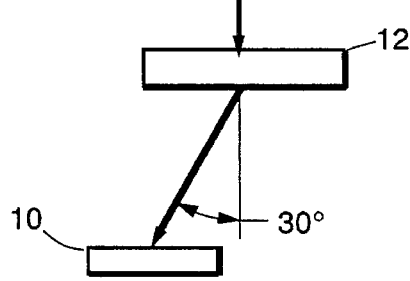
FIG. 3c is an end view showing the position of the detector array with respect to the beam steering device.

FIGS. 3a–3c illustrate a third embodiment of the invention wherein the beam steering device 12, which provides, by example, a 30° tilt with respect to a first axis, is physically rotated, by example, at 45° to a second detector array 10 axis to simultaneously provide tip in two axes. In this embodiment, the physical rotation of 45° results in an optical tilt of 30° along the second axis that is approximately orthogonal to the first axis. This embodiment is well suited for telecentric optical systems, wherein the exit pupil 14 appears at infinity and all f/cones are substantially normal to the radiation receiving surface of the detector array 10. This embodiment is also well suited for use with optical systems in which the exit pupil 14 is large relative to the focal plane height.

A fourth embodiment of the invention is shown in FIGS. 4a–4c. An array 24 of microprisms is arranged in four quadrants (24a–24d) defined by the two major axes (X-Y) of the underlying detector array 10. Within each quadrant the microprisms are arranged to direct the beam at, by example, a 30° angle to the array axes and outwardly away from the array center, wherein each of the quadrants have a corner in common. In addition, the microprism array 24 tips the beam relative to the array surface, This arrangement results in the simultaneous tipping of the input beam in both major axes of the focal plane array 10. This quadrant microprism embodiment generates a cross-shaped non-illuminated region that is centered on the detector array 10. In a manner similar to that shown in FIG. 1d, the physical layout of the detector array pixels 10c is adjusted during fabrication so as to compensate for the presence of the non-illuminated region. That is, the radiation responsive pixels are located away from the non-illuminated region.

As an example of the application of the invention, a 480× 4 detector array was mechanically tilted relative to an illuminating beam at 33° along the long axis (480 pixel), and then mechanically tipped at various angles along the short axis (4 pixel). The optical signature was found to be reduced by a factor of greater than an order of magnitude between a compound tilt angle of 0° and a compound tilt angle of approximately 30°.

Although described in the context of radiation detector assemblies that are comprised of Group II–VI material for detecting IR radiation, it should be realized that the teaching of the invention is also applicable to radiation detector arrays comprised of photovoltaic and photoconductive materials that are sensitive to other regions of the electromagnetic spectrum. For example, the teaching of the invention is also applicable to visible light sensors or sensor arrays that are constructed of silicon. The teaching of this invention also applies to an array comprising a single radiation receiving element. It should also be realized that the teaching of the invention can be used with planar arrays of photodetectors, and is not limited for use with photodetectors having a mesa-type structure. In addition, the teaching of this invention can be employed with front-side illuminated radiation detectors having beam steering devices and microprisms fabricated on a second substrate that is separate from the detector substrate. The second substrate is selected to be transparent to the radiation of interest, and is orientated with respect to the detector substrate, in accordance with the invention, to achieve compound tipping and a reduction in the light signature.

Thus, while the invention has been particularly shown and described with respect to a number of embodiments thereof, it will be understood by those skilled in the art that changes in form and details may be made therein without departing from the scope and spirit of the invention.

What is claimed is:

1. A method of reducing an optical signature from a array having at least one radiation detector, comprising the steps:

providing the array, the array having first and second axes;

tilting the array, with respect to an incident beam of radiation, along a first one of the axes; and tilting the array, with respect to the incident beam of radiation, along a second one of the axes such that a spatial extent of intersections of features of the array, with wavefronts of the radiation, are minimized, thereby reducing reflections of the radiation from the features.

2. A method as set forth in claim 1 wherein the first and the second steps of tilting are both accomplished by physically tilting the array with respect to the incident beam of radiation.

3. A method as set forth in claim 1 wherein the first and the second steps of tilting are both accomplished by optically tilting the array with respect to the incident beam of radiation.

4. A method as set forth in claim 1 wherein one of the steps of tilting is accomplished by optically tilting the array with respect to the incident beam of radiation, and wherein the other one of the steps of tilting is accomplished by physically tilting the array with respect to the incident beam of radiation.

5. A method as set forth in claim 3 wherein the first and second steps of tilting are performed by a beam steering device that is disposed within an optical path of the incident beam of radiation.

6. A method as set forth in claim 3 wherein the first and the second steps of tilting are accomplished by a microprism structure that is fabricated upon or within a radiation receiving surface of the array.

7. A method as set forth in claim 3 wherein the first step of tilting is performed by a beam steering device that is disposed within an optical path of the incident beam of radiation, and wherein the second step of tilting is accomplished by a microprism structure that is fabricated upon or within a radiation receiving surface of the array.

8. A method as set forth in claim 4 wherein the first step of tilting is performed by a beam steering device that is disposed within an optical path of the incident beam of radiation, and wherein the second step of tilting is accomplished by a physical rotation of the features of the array.

9. An array of radiation detectors, comprising:

a substrate having a first radiation receiving major surface and a second major surface that is opposite the first major surface;

a plurality of radiation detector pixels that are disposed adjacent to the second major surface; and a microprism array that is disposed on or within the first major surface, wherein the microprism array is fabricated so as to direct radiation that is incident thereon through said substrate and onto said plurality of radiation detector pixels in such a manner that a spatial extent of intersections of the features of the pixels, with wavefronts of the radiation, are minimized, thereby reducing reflections of the radiation from the features.

10. An array of radiation detectors as set forth in claim 9 wherein the microprism array is partitioned into four quadrants each having a corner that is adjacent to a single point on the first major surface, and wherein each quadrant of said microprism array is fabricated so as to direct radiation that is incident thereon through said substrate in a direction away from the single point.

11. An array of radiation detectors as set forth in claim 9 wherein said microprism array results in the presence of a non-illuminated region at said second major surface, and wherein said radiation detector pixels are disposed outside of said non-illuminated region.

12. A radiation detector assembly, comprising:

a pupil for admitting radiation into said assembly;

an array of radiation detectors disposed for receiving radiation incident thereon, the array of radiation detectors including a substrate having a radiation receiving first major surface and a second major surface that is opposite the first major surface, the array of radiation detectors further including a plurality of radiation detector pixels that are disposed adjacent to one of said major surfaces; and beam steering means disposed between said pupil and said radiation receiving first major surface for directing radiation to said radiation receiving first major surface, wherein said array of radiation detectors is tilted, with respect to the incident radiation, along a first axis and also along a second axis such that a spatial extent of intersections of features of the pixels, with wavefronts of the radiation, are minimized for reducing reflections of the radiation from the features.

13. A radiation detector assembly as set forth in claim 12 wherein the array is physically tilted, along both the first and the second axes, with respect to the incident radiation.

14. A radiation detector assembly as set forth in claim 12 wherein the array is optically tilted, along both the first and the second axes, with respect to the incident radiation.

15. A radiation detector assembly as set forth in claim 12 wherein the array is optically tilted along one axis with respect to the incident radiation and is physically tilted along the other axis with respect to the incident radiation.

16. A radiation detector assembly as set forth in claim 12 wherein said plurality of radiation detector pixels are disposed adjacent to said second major surface, and wherein the array of radiation detectors includes a microprism array that is disposed on or within the first major surface, wherein the microprism array is fabricated so as to direct radiation that is incident thereon through said substrate and onto said plurality of radiation detector pixels in such a manner as to provide an optical tilt of the radiation detector array, with respect to the incident radiation, along one or both of the axes.

17. A radiation detector assembly as set forth in claim 16 wherein the microprism array is partitioned into four quadrants each having a corner that is adjacent to a single point on the first major surface, and wherein each quadrant of said microprism array is fabricated so as to direct radiation that is incident thereon through said substrate in a direction away from the single point.

18. A radiation detector assembly as set forth in claim 16 wherein the microprism array results in the presence of a non-illuminated region at said second major surface, and wherein said radiation detector pixels are disposed outside of said non-illuminated region.

19. An array of radiation detectors, comprising:

a substrate having a first major surface and a second major surface that is opposite the first major surface; and a plurality of radiation detector mesa structures that are disposed adjacent to one of said major surfaces, wherein the plurality of radiation detector mesa structures are disposed relative to a tip axis of the array in such a manner that no linear features of the mesa structures are oriented perpendicularly to the tip axis for reducing reflections of the radiation from the features.

20. An optical assembly including an array having at least one radiation detector, the array having first and second axes, the assembly further comprising:

a pupil for admitting an incident beam of radiation into said assembly;

means for tilting the array, with respect to the incident beam of radiation, along a first one of the axes; and means for tilting the array, with respect to the incident beam of radiation, along a second one of the axes such that a spatial extent of intersections of features of the array, with wavefronts of the radiation, are minimized, thereby reducing reflections of the radiation from the features.

21. An optical assembly as set forth in claim 20 wherein the first and the second means for tilting both include means for physically tilting the array with respect to the incident beam of radiation.

22. An optical assembly as set forth in claim 20 wherein the first and the second means for tilting both include means for optically tilting the array with respect to the incident beam of radiation.

23. An optical assembly as set forth in claim 20 wherein one of the means for tilting includes means for optically tilting the array with respect to the incident beam of radiation, and wherein the other one of the means for tilting includes means for physically tilting the array with respect to the incident beam of radiation.

24. An optical assembly as set forth in claim 22 wherein the first and the second means for tilting are comprised of a beam steering means that is disposed within an optical path of the incident beam of radiation.

25. An optical assembly as set forth in claim 22 wherein the first and the second means for tilting are comprised of a microprism structure that is fabricated upon or within a radiation receiving surface of the array.

26. An optical assembly as set forth in claim 22 wherein the first means for tilting is is comprised of a beam steering means that is disposed within an optical path of the incident beam of radiation, and wherein the second means for tilting is comprised of a microprism structure that is fabricated upon or within a radiation receiving surface of the array.

* * * * *